United States Patent [19]

Schweizer

[11] Patent Number: 5,251,679
[45] Date of Patent: Oct. 12, 1993

[54] APPARATUS FOR SHAPING OUTBOARD TERMINALS OF SURFACE-MOUNTABLE CIRCUIT MODULES

[75] Inventor: Matthias Schweizer, Igenhausen, Fed. Rep. of Germany

[73] Assignee: Siemens Nixdorf Informationssysteme AG, Fed. Rep. of Germany

[21] Appl. No.: 894,253

[22] Filed: Jun. 8, 1992

[30] Foreign Application Priority Data

Jun. 26, 1991 [DE] Fed. Rep. of Germany ....... 4121108

[51] Int. Cl.⁵ ............................ B21F 1/00; B23P 23/00
[52] U.S. Cl. ...................................... 140/105; 29/827; 29/566.3
[58] Field of Search ............... 140/105; 29/741, 566.2, 29/566.3, 827, 882

[56] References Cited

U.S. PATENT DOCUMENTS

| | | | |
|---|---|---|---|
| 3,796,201 | 3/1974 | Golub | 140/105 |
| 3,903,934 | 9/1975 | Vizy | 140/105 |
| 4,399,610 | 8/1983 | Moyer | 29/827 |
| 4,466,183 | 8/1984 | Burns | 29/827 |
| 4,812,421 | 3/1989 | Jung et al. | 29/827 |
| 4,945,954 | 8/1990 | Wehrly, Jr. et al. | 140/105 |
| 5,065,504 | 11/1991 | Olla | 140/105 |

Primary Examiner—Lowell A. Larson
Assistant Examiner—Michael J. McKeon
Attorney, Agent, or Firm—Hill, Steadman & Simpson

[57] ABSTRACT

The present invention is directed to a method and apparatus for bending and cutting outboard terminals, or leads, of surface mountable integrated modules applied to a carrier frame wherein slots are cut in the carrier frame so that retaining webs remain between the slots and the circuit modules. Each of the retaining webs interconnects the outboard terminals along one side of the circuit module to stabilize the terminals during a subsequent bending of the leads. A combination cutting and bending die is moved downward to cut the retaining webs free from one another and to bend the leads into their desired shape. The retaining webs and any excess length of the outboard terminals is then trimmed off, all while the circuit module is held in a hold-down part so that no stresses are transferred to the chip module during bending.

1 Claim, 4 Drawing Sheets

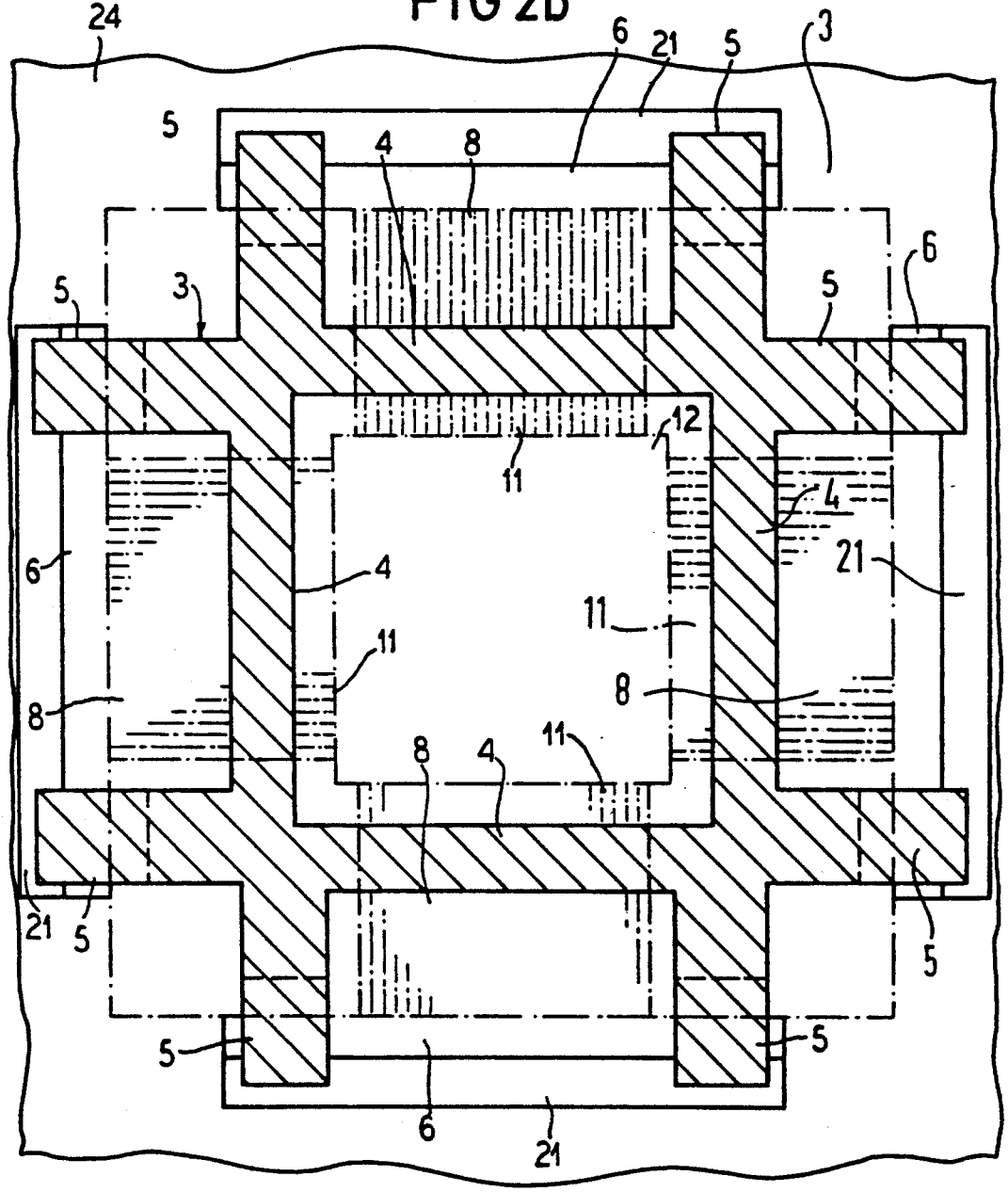

APPARATUS FOR SHAPING OUTBOARD TERMINALS OF SURFACE-MOUNTABLE CIRCUIT MODULES

BACKGROUND OF THE INVENTION

1. Field of the Invention

The present invention is directed generally to a method for shaping outboard terminals of surface-mountable integrated circuit modules applied on a film carrier and for an apparatus for performing the method.

2. Description of the Related Art

Surface mountable integrated modules include an integrated circuit chip incased within a plastic chip housing and outboard terminals, or leads, extending from the chip housing. During manufacture of such surface mountable integrated modules, the outboard leads are initially formed in frame-like structure extending outwardly to a so-called film carrier. The integrated circuit chip is mounted on the frame-like structure, electrical connections are made between the circuitry on the chip and the outboard terminals, and the circuit chip is encased in a chip housing. The chip housing is, thus, suspended on the leads, or outboard terminals, in the frame structure. The surface mountable integrated modules applied on the film carrier or frame are referred to as micropacks.

The leads or terminals are cut to free the module from the frame. After the modules have been cut out, the outboard terminals or leads generally assume dimensionally imprecise positions as the result of internal stresses. During the subsequent bending of the outer leads, these positional errors are further increased, which results in the outer leads no longer being at known positions relative to the chip module. The leads are, thus, not in alignment with solder pads provided on a printed circuit board on which the module is to be affixed. Fault free connections between the chip module and the circuit board are thereby not guaranteed.

SUMMARY OF THE INVENTION

It is an object of the present invention to provide a method and apparatus for shaping the outer leads of surface mountable integrated modules applied on a film carrier by which the correctness of the positions of the individual outer leads of the modules relative to one another and relative to solder pads on which the leads are to be affixed is guaranteed.

The present method is begun only after the so-called micropacks have already been formed. The micropacks are formed when a frame-like film carrier of film carrier material such as, for example, Kapton or Upilex, having the outboard terminals formed thereon is, first, provided with a integrated circuit chip and, second, the chip is enclosed in a plastic chip housing. The resulting micropack includes a chip housing suspended in an opening a substrate of the film carrier by the terminal legs which extend across the opening in the substrate.

According to the method of the invention, four slots are cut in the film carrier proceeding perpendicularly relative to neighboring slots. In other words, the slots are arranged generally along the sides of a rectangle. The four slots are spaced from the edges of the substrate at the opening so that retaining webs of film carrier material are preserved along the sides of the opening facing toward the module or chip housing. Each of the retaining webs connect all of the outer leads along one side of the module or chip housing to one another. Of course, the method of the invention is applicable to circuit modules having leads along, for example, only two sides.

Subsequently, the retaining webs are separated from one another at the four corners of the module or chip housing and then the outer leads are bent into the prescribed shape. The prescribed shape for a surface mountable device may be a Z or J shape. As a final step, the outer leads are cut to their ultimate length. The surface mountable integrated circuit chip is then ready for mounting on a printed circuit board. Since the bending of the leads takes place while the leads are interconnected, their relative alignment is preserved. The cutting and bending of the leads is, thus, performed in a single work cycle.

The apparatus for implementing the method of the present invention includes an automatic slotting unit for cutting the slots in the frame-like film carrier and an automatic bending unit for bending the leads. The bending unit includes a vertically movable cutting and bending tool that includes four bending dies which are rigidly connected to one another and are arranged in a quadrangle, or rectangular. Horizontal extensions from the ends of the bending dies form cutting dies for separating the retaining webs from one another. The cutting dies project lower than the lower edge of the bending dies in the vertical direction so that the retaining webs are cut apart before bending of the leads commences. A pneumatic cylinder is provided for driving the cutting and bending tool. The automatic cutting and bending unit also includes four trimming dies for trimming off the waste ends of the leads, the trimming dies being arranged immediately behind the bending dies relative the chip module and being movable vertically relative to the bending dies.

The automatic cutting and bending unit also includes a lower bending part in the shape of a rectangular, hollow column which is arranged under the vertically movable cutting and bending tool. The rectangular, hollow column has its upper edges shaped to correspond to the desired shape of the outer leads of the modules and is thereby adapted to the shape of the lower edge of the vertically movable bending die. A module support element is provided in the central cavity of the hollow lower bending part. The support element has an upper surface matched to the external shape of the circuit module housing and in a preferred embodiment is vertically displaceable within the cavity so as to be movable into a position supporting the module from the underside during the bending operation. Detent or stop members for limiting the vertical stroke of the cutting and bending tool at its lowest point are provided at the four corners of the lower bending part spaced below the upper edge of the lower bending part by a predetermined distance.

Also provided in the cutting and bending unit is a rigidly mounted hold-down means mounted in the interior of the rectangularly arranged bending dies for holding the leads of the modules in position against the lower bending part during the bending and cutting steps to prevent dislocation of the leads.

By applying the method and apparatus of the present invention, a retaining web is retained that interconnects the outer leads along each of the four sides of the module so that no twisting or lateral movement of the outer leads of the modules due to torsional or longitudinal stresses can occur during the subsequent bending. Immediately after bending of the outboard leads and without additional follow-up work, the module which has been prepared according to this method may be solder directly onto an appertaining printed circuit board, since the outer leads are held exactly in the appropriate relative spacings. Internal stresses on the individual outer leads are, thus, relieved during the bending process.

BRIEF DESCRIPTION OF THE DRAWINGS

The present invention shall be set forth in greater detail with reference to exemplary embodiments shown in FIGS. 1a through 3b.

FIG. 2b is a horizontal cross section through the bending die and cutting tool of the bending and cutting unit also showing the film carrier in plan view therebelow after the slots have been cut therein, the chip housing and outer leads being shown in phantom;

FIG. 3b is a top plan view of the lower bending part of FIG. 3a.

DETAILED DESCRIPTION OF THE PREFERRED EMBODIMENTS

Figure 1A:
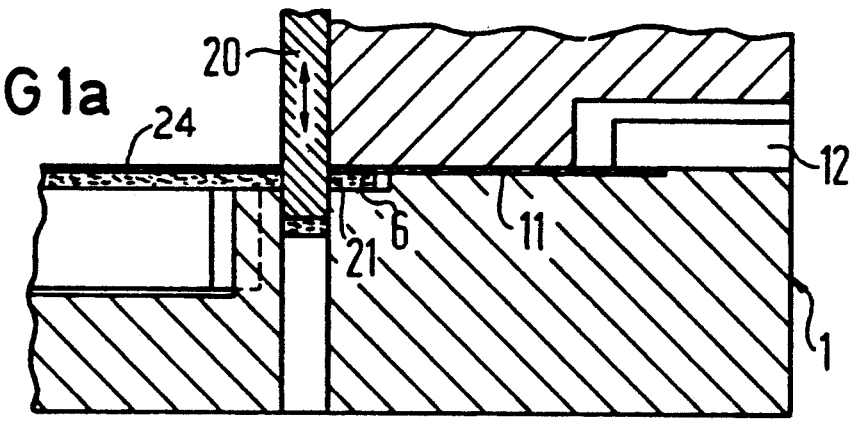
FIG. 1a is a cross section along a vertical plan of a portion of a slotting unit for cutting a slot in a film carrier upon which has been mounted a chip housing or module as a first step of the present method.

In FIG. 1a is shown a portion of a frame-like film carrier 24 carrying outer leads 11, which may include test lines and test pads, that extend to a circuit module or chip housing 12. The outer leads 11 are those leads which extend out of the plastic chip housing for connection to external circuit elements. In the exemplary embodiment, the leads extend out of all four sides of the chip module, although other arrangements are also possible, including leads extending out of only two sides. The film carrier is composed of Kapton or Upilex, for example.

The film carrier is mounted in an automatic slotting unit 1 having a vertically moving slotting tool 20 which cuts four slots 21 into the frame-like film carrier 24. The slots 21 are positioned so that a retaining web 6 of the film carrier material is left along the inside of the frame-like structure 24. The retaining web 6 of a preferred embodiment is approximately 1.0 millimeter wide. The outer leads 11 are connected to one another by the retaining web 6 so that the overall bending of the outer leads can proceed in unison without displacement of the leads.

The film carrier frame 24 into which the four slots 21 have been cut is shown in plan view in FIG. 2b with the module housing 12 and outer leads 11 being shown in phantom therein.

Figure 1B:
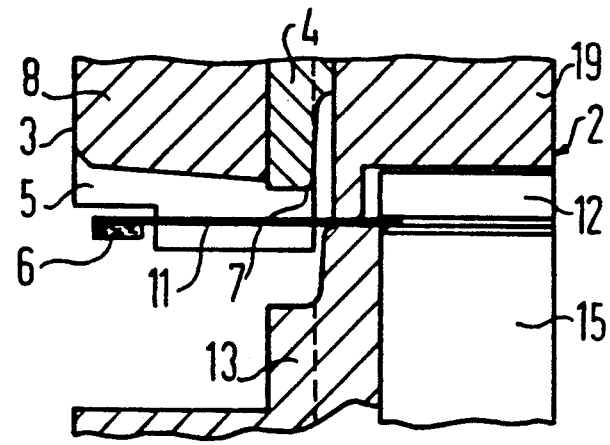
FIG. 1b is a cross section along a vertical plan of a portion of a cutting and bending unit for performing a second step in the method sequence according to the principles of the present invention.

After the slots 21 have been cut, the carrier frame 24 with the circuit module 12 is transferred into a cutting and bending unit 2 shown in FIG. 1b. A supporting element 15 having a quadrilateral shape in the present case moves vertically from an initial position to a position pressing against a lower surface of the circuit module 12 and holding the module 12 fast in a hold-down means 19 disposed above the module 12. A cutting and bending tool 3, details of which shall be set forth in greater detail hereinafter, separates the retaining webs 6 from each other and from the rest of the frame-like film carrier 24 by cutting the ends of the retaining webs 6 from the carrier frame 24.

Figure 1C:
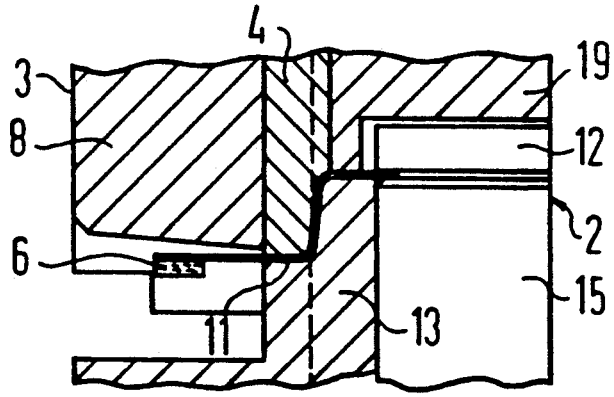
FIG. 1c is a cross section of the cutting and bending unit shown in FIG. 1b showing a third step in the method of the invention.

In the following step, the outer leads 11 are pressed onto a lower bending part 13 and held fast there by the hold-down means 19. This has a strain-relieving effect on the leads to prevent damage to bonding of the inner ends of the leads 11 during the bending step of the leads. A bending die portion 4 of the cutting and bending tool 3 undergoes a vertical motion to press the outer leads onto the lower bending part 13 and thereby form a Z-shaped bend in the outer leads 11. The vertical motion of the cutting and bending tool 3 is accomplished by a pneumatic cylinder 9 shown schematically in FIG. 2a. The downward movement of the bending die portion 4 of the cutting and bending tool 3 continues until the final position shown in FIG. 1c is reached. The final position of the bending process is limited by four stop sections 17 shown in FIG. 2a, so that a constant bending gap of approximately 0.4 millimeters is guaranteed. Stress points and plastic deformations of the outer leads 11 thus are completely avoided when bending of the leads according to the present invention is performed.

Figure 1D:
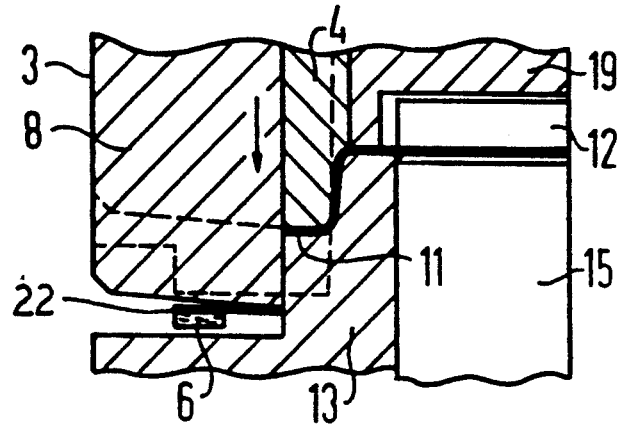
FIG. 1d is a cross section of the cutting and bending unit shown in FIGS. 1b and 1c showing a fourth step in the present method.

As a final step, shown in FIG. 1d, projecting parts 22 of the outer leads 11 together with the retaining web 6 are cut off at a desired length and disposed of in a waste collecting container. The projecting parts, or waste outer leads, 22 are cut off by vertical movement of a trimming die 8 which interacts with an outer edge of the lower bending part 13 for form a shear. The surface mountable integrated module 12 is then ready for mounting on a printed circuit board.

Figure 2A:
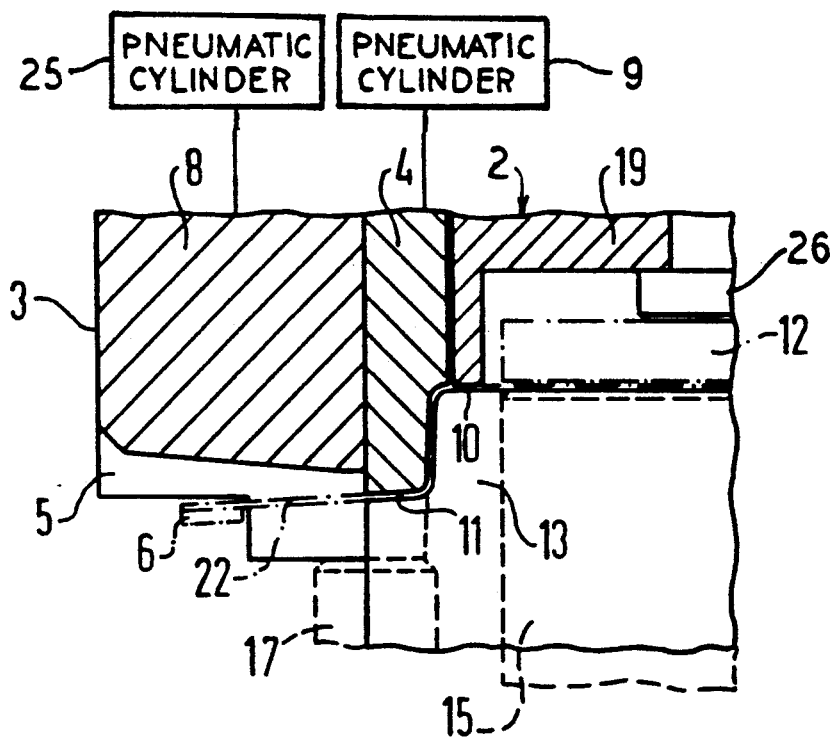
FIG. 2a is a cross section of the cutting and bending tool along a vertical plan distinct from the cross section plane of FIGS. 1b through 1d and showing the abutment of the cutting die against the stop section.

With reference to FIG. 2a, the cutting and bending unit 2 is shown in cross section including the cutting and bending tool 3 driven by the cylinder 9 and the trimming die 8 which is separately vertically moveable by a pneumatic cylinder 25 relative to the cutting and bending die 3. The cutting and bending tool 3 is composed of the bending die portion 4 and the cutting die portion 5 formed in one piece. The tool 3 is moved downward until the cutting die portion 5 abuts the stop, or detent, section 17. It can be seen that the cutting die 5 extends lower than the bending die 4, which enables the retaining webs 6 to be cut from one another prior to bending of the leads 11.

The lower bending part 13 includes the supporting element 15 within the rectangular core thereof, the supporting element 15 supporting the underside of the circuit module 12. The upper side of the circuit module 12 is supported by an upper supporting element 26 within the hold-down means 19, as shown in FIG. 2a.

With reference to FIG. 2b, the carrier frame 24 is shown in plan view with a rectangular opening therein across which extends the outer leads 11 to each of the four sides of the chip module 12. The slots 21 have already been cut in the carrier frame 24 so that the retaining webs 6 remain.

Shown in cross section above the frame-like carrier film 24 in FIG. 2b is the cutting and bending tool 3 including the four bending dies 4 arranged in a rectangle relative to one another. Within the center of the rectangular bending dies is positioned the hold down means 19 shown in FIGS. 1b through 2a. The hold down means is thus of a rectangular shape. Extending from the short sides of the bending dies 4 as horizontal extensions of the bending dies 4 are the cutting die portions 5, which act to separate the retaining webs 6 from one another and from the carrier frame 24. The cutting dies 5 extend lower than the lower edge 7 of the bending dies 4.

Immediately adjacent the bending dies 4 on the opposite side thereof from the chip module 12 and extending between the cutting dies 5 are the trimming dies 8. As previously indicated, the trimming dies 8 are vertically moveable relative to the bending dies 4.

The lower bending part 13, a portion of which is shown in FIGS. 1b through 1d, has four sides disposed beneath the four bending dies 4, the four sides of the lower bending part 13 being shaped to correspond to the desired form of the bent leads and, thus, to the shape of the bending dies 4. In the present example, the Z-like desired shape of the outer leads is achieved as the bending dies 4 glide down over the lower bending part 13. The cutting and bending tool 3 is limited in its lowest vertical position by four stop sections 17 arranged at a prescribed distance under the four corner parts of the bending die 4 and on which the front part of the lower edge of the cutting die 5 rests. Of course, other shapes of outer leads are possible but providing bending dies and lower parts of a different shape.

Any projecting portions 22 of the outer leads extending out of the bending dies 4, together with the retaining web 6, are cut off as waste by the trimming die 8, which is only placed in motion after the end of the bending process. The outermost edge of the bending dies 4 forms a vertical surface having an uppermost corner edge. The lower edge of the trimming die 8 forms a shear with the outer edge of the bending die 4 to cut off the waste portions 22 of the outer leads 11.

Figure 3A:
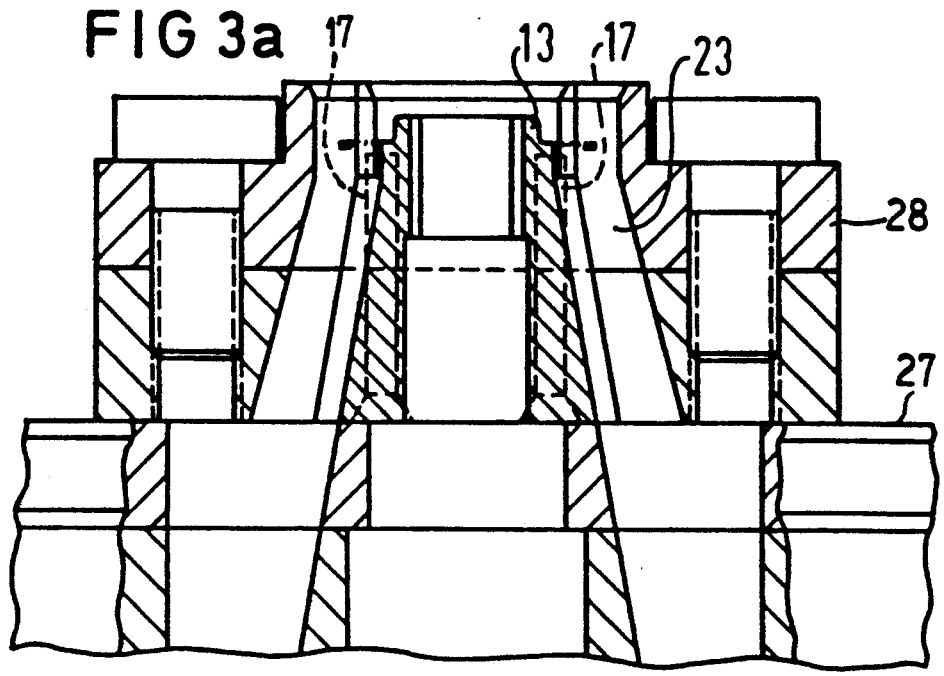
FIG. 3a is a cross section along a vertical plan of the lower bending part of the cutting and bending unit.

An overall view of the lower bending part 13 is shown in FIG. 3a in greater detail. The lower bending part 13, with the stop sections 17, are mounted on a base 27 within a structural unit 28. In the structural unit 28 are provided waste channels 23 adjacent to the lower bending part 13 along which projecting parts 22 of the outer leads 11 drop after being cut off in the cutting process. A collecting container (not shown) is situated below the waste channels 23.

Figure 3B:
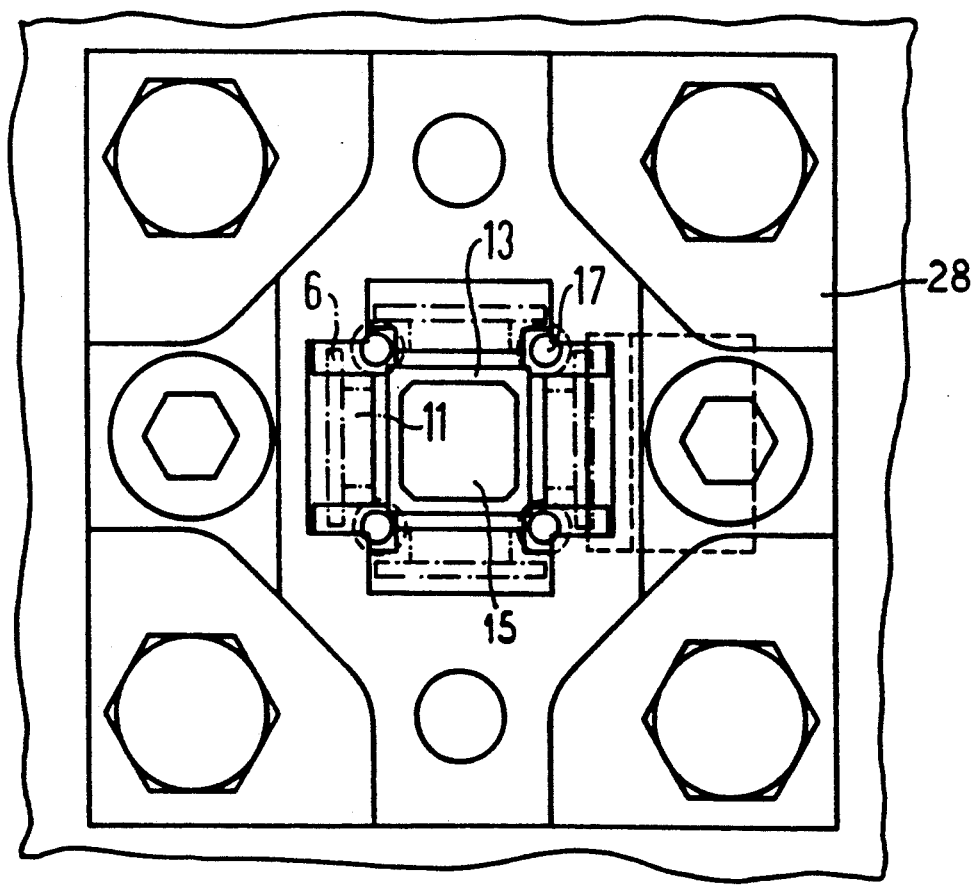

In FIG. 3b is shown a plan view of the lower bending part 13 in the center of which is mounted the supporting element 15 and on the corners of which are provided the stop segments 17. As can seen, the lower bending part 13 has correspondingly shaped bending dies along four sides corresponding to the bending dies 4 in the vertically moveable cutting and bending tool 3.

Thus, there is shown a method and apparatus for shaping outboard terminals of surface mountable integrated modules. According to the method, four slots extending perpendicularly relative to neighboring slots are cut in the film carrier, the slots being arranged to leave the retaining webs at sides of the film carrier facing toward the chip module so that the leads are interconnected. The retaining webs insure that subsequent bending and cutting of the outer leads may be performed without torsional and longitudinal stresses causing an undesired misshaping of the outer leads. The bending and cutting of the leads occurs in a single work cycle.

Although other modifications and changes may be suggested by those skilled in the art, it is the intention of the inventor to embody within the patent warranted hereon all changes and modifications as reasonably and properly come within the scope of his contribution to the art.

I claim:

1. An apparatus for shaping outboard terminals of a surface-mountable integrated component applied to a carrier having the terminals extending to the component, comprising:

an automatic slotting unit for cutting slots in the carrier thereby forming retaining webs;

an automatic cutting and bending tool including:
four bending dies rigidly joined to one another and arranged in a quadrangle, lower die faces being shaped to a desired shape of the terminals,
cutting dies joined to said four bending dies as horizontal extensions of sides of said quadrangle, said cutting dies extending below a lower edge of said four bending dies to separate the retaining webs from one another;

a pneumatic cylinder for driving said cutting and bending tool in a vertical direction;

four trimming dies positioned immediately adjacent said four bending dies and being vertically movable relative to said four bending dies;

a lower bending part being a hollow rectangular column arranged below said cutting and bending tool, upper edges of said lower bending part being shaped to correspond to a desired shape of the terminals and adapted to a shape of said four bending dies;

a supporting element having a surface adapted to a shape of the component and being vertically displaceable in a cavity of said hollow rectangular column of said lower bending part;

stop sections at four corners of said lower bending part at a predetermined distance below said upper edges of said lower bending part for abutment with said cutting and bending tool to limit a vertical stroke of said cutting and bending tool; and module hold-down means in an interior of said four bending dies for holding the terminals of the component on said lower bending part.

* * * * *